United States Patent
Fan

(10) Patent No.: US 9,601,413 B2
(45) Date of Patent: Mar. 21, 2017

(54) CAVITY PACKAGE WITH DIE ATTACH PAD

(71) Applicant: Ubotic Company Limited, Tsuen Wan (CN)

(72) Inventor: Chun Ho Fan, Tsuen Wan (CN)

(73) Assignee: UBOTIC COMPANY LIMITED, Hong Kong (CN)

( * ) Notice: Subject to any disclaimer, the term of this patent is extended or adjusted under 35 U.S.C. 154(b) by 21 days.

(21) Appl. No.: 14/250,869

(22) Filed: Apr. 11, 2014

(65) Prior Publication Data
US 2014/0306333 A1 Oct. 16, 2014

Related U.S. Application Data

(60) Provisional application No. 61/810,813, filed on Apr. 11, 2013.

(51) Int. Cl.
| | |
|---|---|
| *H01L 23/48* | (2006.01) |
| *H01L 23/495* | (2006.01) |
| *H01L 23/057* | (2006.01) |
| *H01L 21/50* | (2006.01) |
| *H01L 21/56* | (2006.01) |

(52) U.S. Cl.
CPC ........... *H01L 23/495* (2013.01); *H01L 21/50* (2013.01); *H01L 21/56* (2013.01); *H01L 23/057* (2013.01); *H01L 23/49506* (2013.01); *H01L 23/49517* (2013.01); *H01L 23/49551* (2013.01); *H01L 2924/0002* (2013.01)

(58) Field of Classification Search
CPC ....... H01L 23/495; H01L 21/50; H01L 21/56; H01L 23/057; H01L 23/49506; H01L 23/49517; H01L 23/49551
See application file for complete search history.

(56) References Cited

U.S. PATENT DOCUMENTS

| | | | | |
|---|---|---|---|---|
| 4,872,047 A | * | 10/1989 | Fister | ................ H01L 23/49866 257/746 |
| 4,874,722 A | * | 10/1989 | Bednarz | .................. H01L 21/50 156/69 |
| 5,034,568 A | | 7/1991 | Mather | |

(Continued)

FOREIGN PATENT DOCUMENTS

EP 0 436 907 A2 7/1991

OTHER PUBLICATIONS

Official Communication issued in corresponding European Patent Application No. 14164158.9, mailed on Feb. 27, 2015.

*Primary Examiner* — Nicholas Tobergte
(74) *Attorney, Agent, or Firm* — Keating and Bennett, LLP

(57) ABSTRACT

A cavity package is provided. The package can include a metal leadframe and a substrate attached to an interposer formed as part of the leadframe. The substrate typically has a coefficient of thermal expansion matched to the coefficient of thermal expansion of a semiconductor device to be affixed to the substrate. The semiconductor device is typically attached to an exposed top surface of the substrate. The cavity package also includes a plastic portion molded to the leadframe forming a substrate cavity. The substrate cavity allows access to the exposed top surface of the substrate for affixing the semiconductor device. The cavity package also include a connective element for grounding a lid through an electrical path from the lid to the interposer.

5 Claims, 10 Drawing Sheets

(56) References Cited

U.S. PATENT DOCUMENTS

| | | | | |
|---|---|---|---|---|
| 5,258,648 A | * | 11/1993 | Lin | G01R 31/2863 |
| | | | | 257/747 |
| 5,332,864 A | * | 7/1994 | Liang | H01L 23/49513 |
| | | | | 174/523 |
| 5,440,170 A | | 8/1995 | Tsuji et al. | |
| 5,483,740 A | | 1/1996 | Maslakow | |
| 5,598,031 A | * | 1/1997 | Groover | H01L 23/057 |
| | | | | 257/668 |
| 7,245,007 B1 | * | 7/2007 | Foster | H01L 23/49527 |
| | | | | 257/666 |
| 2008/0150064 A1 | * | 6/2008 | Zimmerman | H01L 23/10 |
| | | | | 257/433 |
| 2008/0211089 A1 | * | 9/2008 | Khan | H01L 23/16 |
| | | | | 257/723 |
| 2012/0319256 A1 | * | 12/2012 | Lo | B81B 7/0061 |
| | | | | 257/666 |
| 2013/0093031 A1 | * | 4/2013 | Gao | H01L 29/66007 |
| | | | | 257/417 |

* cited by examiner

CAVITY PACKAGE WITH DIE ATTACH PAD

RELATED APPLICATIONS

This application claims priority from U.S. patent application 61/810,813, filed Apr. 11, 2013. Priority is claimed to this earlier filed application and the contents of this earlier-filed application are incorporated herein, in their entirety, by reference.

FIELD OF INVENTION

The present invention relates generally to integrated circuits, and more particularly to a cavity package with die attach pad.

BACKGROUND

Leaded packages such as SOIC (small-outline-integrated-circuit) and flat no-leads packages such as QFN (quad-flat no-leads) and DFN (dual-flat no-leads) are used to physically and electrically connect integrated circuits to printed circuit boards. Two types of flat no-leads packages are common: cavity (i.e. with a cavity designed into the package containing air or nitrogen), and plastic-molded (i.e. with minimal air in the package). The cavity package is usually made up of three parts; a copper leadframe, plastic-moulded body (open, and not sealed), and a lid.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1A:
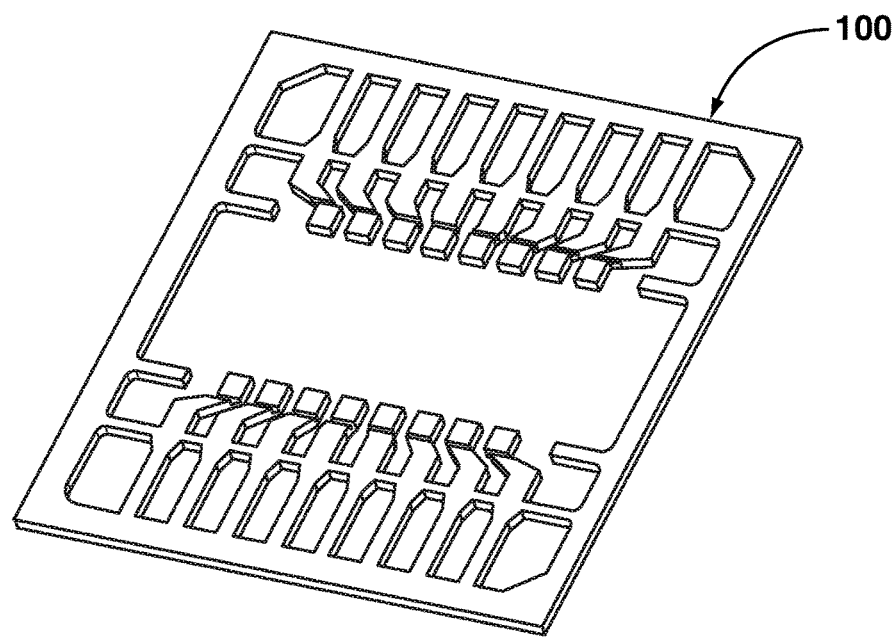
FIGS. 1A and 1B are schematic illustrations showing construction of a cavity package according to the prior art.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

According to an aspect, a cavity package is provided. The cavity package can comprise:
  a metal leadframe;
  a substrate attached to the leadframe, the substrate having an exposed top surface, the substrate further having a coefficient of thermal expansion matched to the coefficient of thermal expansion of a semiconductor device to be affixed to the substrate; and
  a plastic portion molded to the leadframe forming a substrate cavity including an exposed top surface of the substrate for affixing the semiconductor device.

The metal frame can include an interposer and the substrate is attached to the interposer. The substrate can include electrically isolated metallic features on the top surface for wire bonding with the semiconductor device. The metallic features can form a ground plane and are for connection with the interposer. The metallic features can also form a power plane. The cavity package can further comprise:
  a metal lid attached to the plastic portion for closing and encapsulating the substrate cavity; and
  a connective element for grounding the lid by electrical path from the lid to the interposer.

The plastic portion can include a slot and the connective element can be inserted into the slot. The connective element can be fabricated with the leadframe. The metal features can be fabricated on an exposed bottom surface of the substrate for soldering to a PCB board for facilitating heat dissipation. The substrate can be made from one of: Aluminum Oxide (Al2O3), Aluminum Nitride (AlN), Ceramic, Silicone (Si), Gallium Arsenide (GaAs).

According another aspect, a method of constructing a cavity package, is provided. The method can comprise:
  fabricating a metal leadframe;
  attaching a substrate to the leadframe, the substrate having a coefficient of thermal expansion matched to the coefficient of thermal expansion of a semiconductor device to be affixed to the substrate; and
  molding plastic to the leadframe to form a plastic portion forming a substrate cavity including an exposed top surface of the substrate for affixing the semiconductor device.

The molding can be performed prior to attaching the substrate to the leadframe. The molding can further comprise:
  molding the plastic portion to the substrate-attached leadframe to form the substrate cavity.

The method can further comprise:
  laminating tape onto a bottom surface of the leadframe; and
  attaching the substrate to the leadframe can comprise placing the substrate onto the tape at a center of the leadframe.

The method can further comprising:
removing the tape after the molding.

The fabricating can further comprise fabricating an interposer as part of the leadframe and the attaching can further comprise attaching the substrate to the interposer.

The method can further comprise:
fabricating electrically isolated metallic features on the top surface of the substrate for wire bonding with the semiconductor device to be affixed to the substrate, the metallic features forming a ground plane and being for connection with the interposer.

The method can further comprise:
forming a connective element;
attaching a metal lid to the plastic portion for closing and encapsulating the substrate cavity; and
forming an electrical path between the lid and the interposer by forming a contact with the connective element and the lid.

The forming of the connective element can further comprise:
forming the connective element as part of the leadframe The forming of the connective element can further comprise:
forming a slot into the plastic portion; and
inserting conductive material into the slot.

Figure 1B:
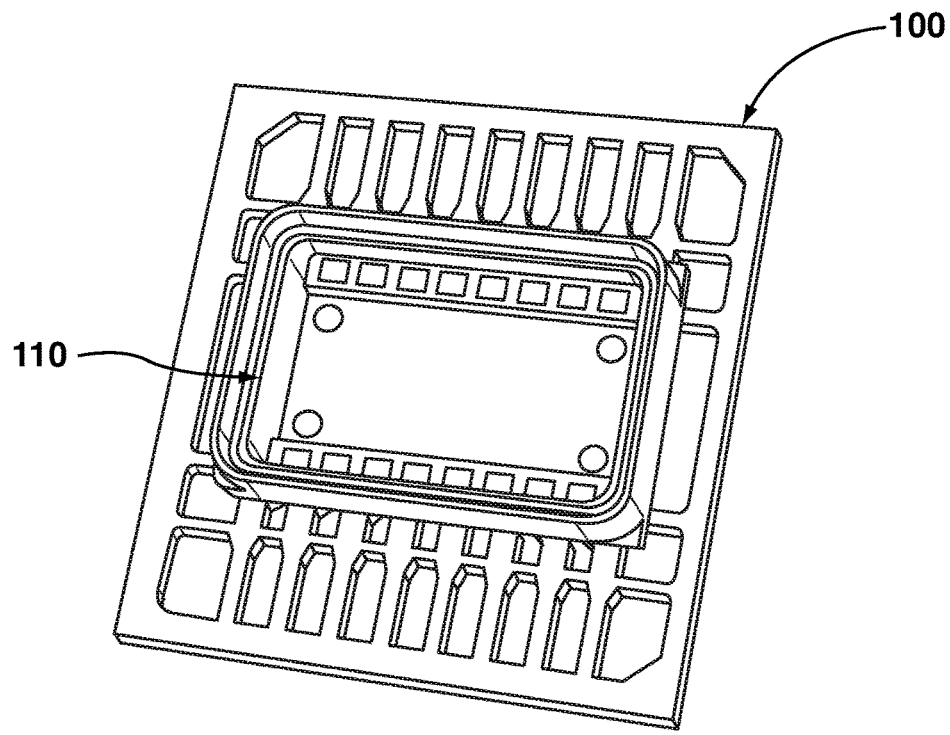

With reference to FIGS. 1A and 1B, construction of a prior art SOIC (Small Outline Integrated Circuit) cavity package is shown, beginning with fabrication of a metal (e.g. Cu) leadframe 100 (FIG. 1A) followed by application of a plastic molding 110 to form a pre-molded cavity leadframe (FIG. 1B) to which the semiconductor die is attached directly on plastic Die Attach Paddle (DAP) which is part of the molded body in the center, followed by wire bonding and a lid (not shown) for encapsulating the wires and die. The cavity package can then be placed onto a printed circuit motherboard.

The inventor has recognized that a substrate made of material (e.g. Aluminum Oxide ($Al_2O_3$), Aluminum Nitride (AlN), Ceramic, Silicone (Si), Gallium Arsenide (GaAs), etc.) can be used to replace the plastic DAP of the molded body for the purpose of matching the coefficient of thermal expansion with the semiconductor device (die) to be affixed to the top of the substrate. This is to mitigate any temperature-induced stress from the affixed semiconductor device.

The substrate can also be fabricated with electrically-isolated metal features on top of the substrate for power and ground bonding, that additional metal features can also be fabricated onto the bottom of the substrate for better thermal interface with the printed circuit motherboard, and that it is desirable to provide an electrical path through the cavity package between the substrate and the lid.

Figure 2A:
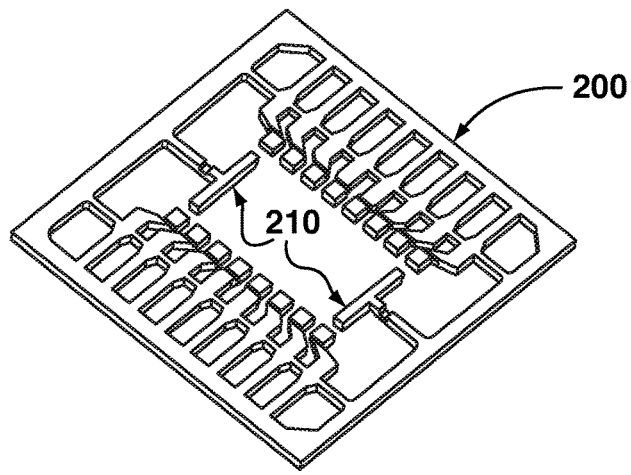
FIGS. 2A-2E are schematic illustrations showing construction of a cavity package according to an embodiment of the present invention.
Figure 2B:
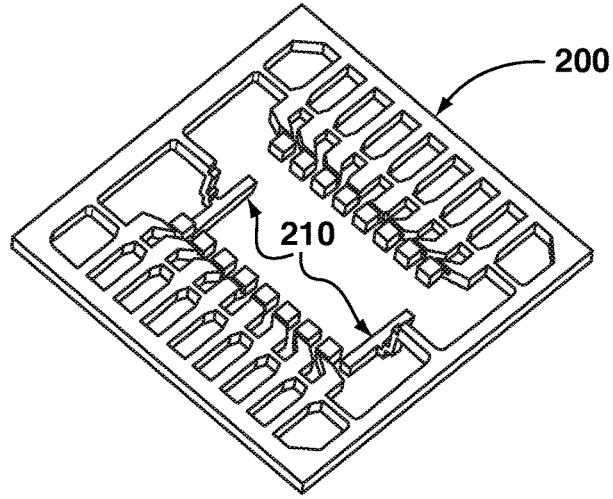

Turning to FIGS. 2A-2E and 3, construction of a cavity package is set forth according to an embodiment of the present invention. At 300, a metal (e.g. Cu) leadframe 200 is fabricated with at least one interposer 210, as shown in FIG. 2A. In variations, the interposer can be in the shape of a "T", an "I", as in this example, or a ring.

The metal leadframe 200 can either be pre-plated with wire bondable finish (e.g. Silver (Ag), Nickel/Palladium/Gold (Ni/Pd/Au), etc) or post-plated after plastic cavity molding (discussed below with reference to 330).

Figure 2C:
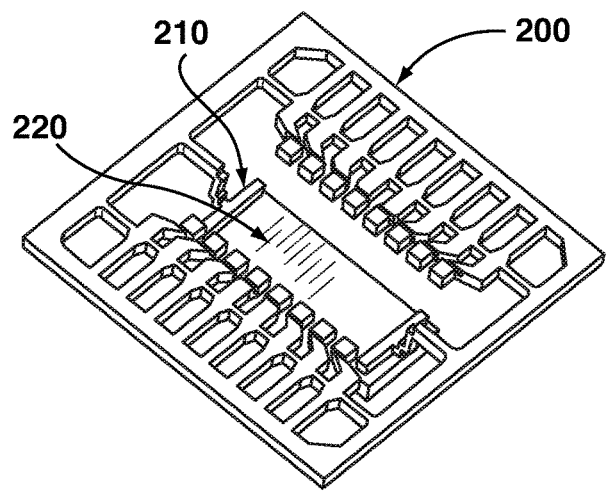
Figure 2D:
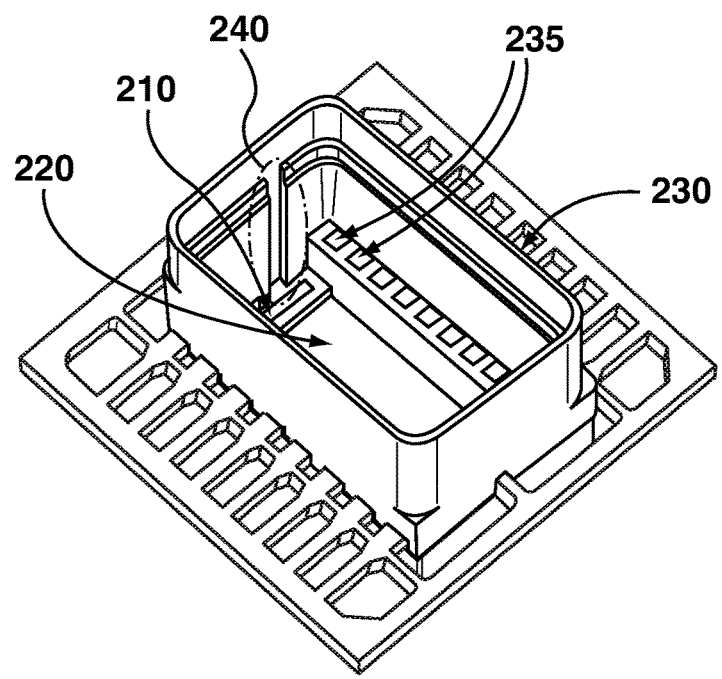
Figure 2E:
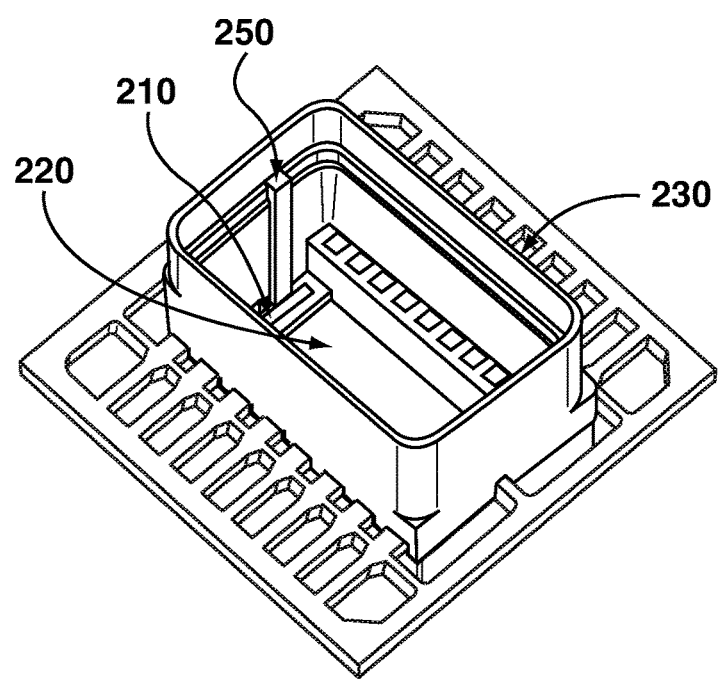
Figure 3:
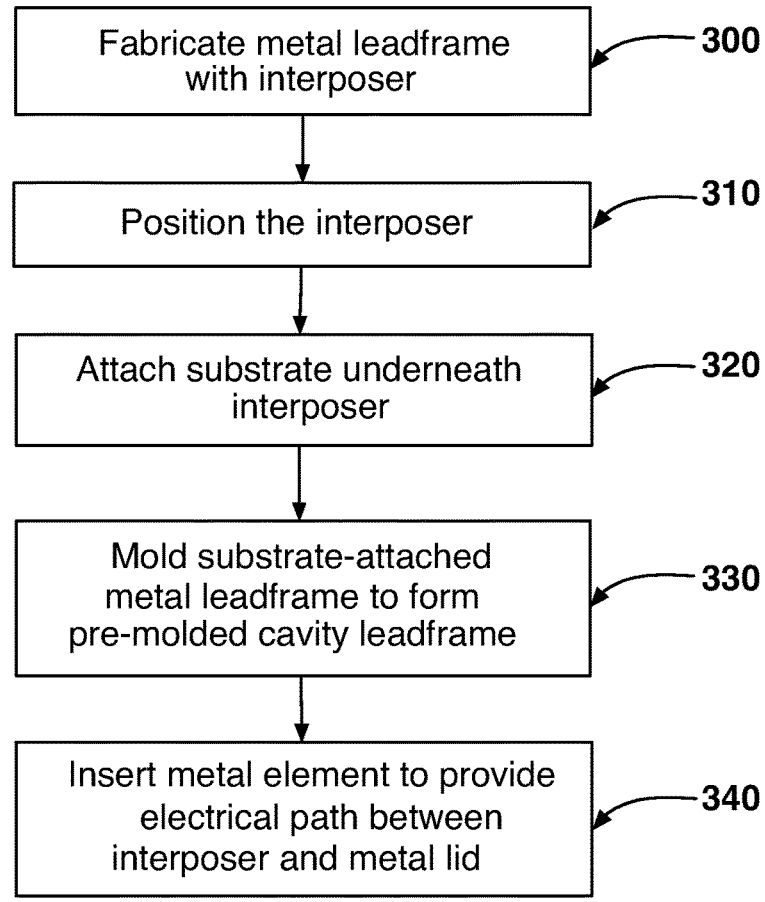
FIG. 3 is a flowchart showing steps in a process for constructing the cavity package of FIGS. 2A-2E.

At 310, the interposer 210 is positioned downwardly (FIG. 2B) and at 320 an appropriately dimensioned substrate 220 is positioned within the leadframe 200 and metallic feature(s) thereof are attached to the interposer 210, for example using epoxy, soldering, welding, etc. (FIG. 2C).

The substrate is made of material (e.g. Aluminum Oxide ($Al_2O_3$), Aluminum Nitride (AlN), Ceramic, Silicone (Si), Gallium Arsenide (GaAs), etc.) for the purpose of matching the coefficient of thermal expansion with the semiconductor device (die) to be affixed to the top of the substrate, in order to mitigate any temperature-induced stress from the affixed semiconductor device. The substrate 220 also provides a heat spreading surface to dissipate the heat generated from the semiconductor device once it has been affixed and is operational.

The substrate 220 may be fabricated with metal feature(s) on the top surface for connection with the interposer 210 and for wire bonding to the die. The metal features would allow the formation of either a ground plane or a power plane or both. Metal features may also, optionally, be fabricated on the bottom surface for soldering to the PCB mother board (not shown).

The interposer 210 therefore provides a bonding surface and coupling interface with the substrate 220.

At 330, the substrate-attached leadframe is molded to form a pre-molded cavity leadframe 230 featuring the top side of the inner leadframe leads 235 and top side of the interposer 210 exposed for wire bonding, the top side of the substrate 220 exposed for die attach and wire bonding, and the bottom side of the substrate 220 (not shown) exposed for bonding to the PCB motherboard.

The pre-molded cavity leadframe 230 includes a slot 240 (FIG. 2D) into which a conductive element 250 is inserted at 240 (FIG. 2E), to provide an electrical path to connect the interposer 210 to a metal lid (not shown) for closing and encapsulating the substrate cavity. The electrical path could be used for grounding. In variations, there can be more than one cavity leadframe 230 and conductive element 250 per interposer 210.

Figure 4:
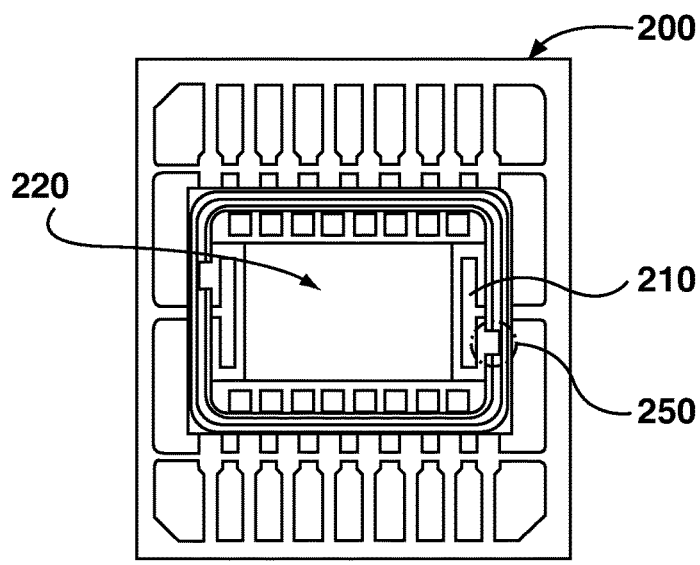
FIG. 4 is a plan view of the cavity package constructed according to FIGS. 2A-2E and 3.

FIG. 4 is a plan view of the cavity-molded leadframe 230 with pre-attached substrate, according to the embodiment of FIGS. 2A-2E and 3.

Figure 5A:
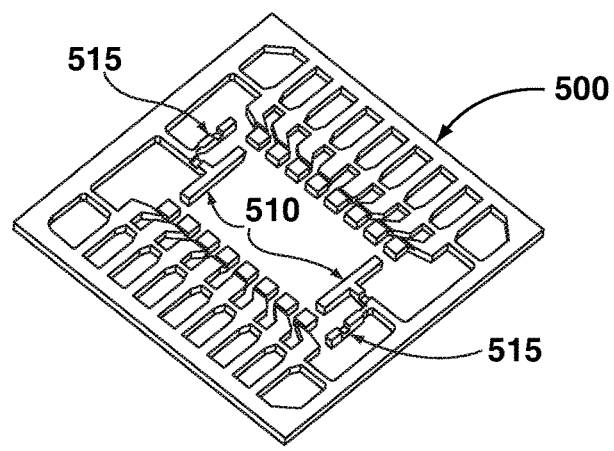
FIGS. 5A-5D are schematic illustrations showing construction of a cavity package according to a further embodiment of the present invention.

Turning to FIGS. 5A-5D and 6, construction of a cavity package is set forth according to an alternative embodiment of the present invention. At 600, a metal (e.g. Cu) leadframe 500 is fabricated with at least one interposer 510 and connective element 515, as shown in FIG. 5A. In the illustrated embodiment, connective element 515 replaces connective element 250 of the embodiment set forth in FIGS. 2A-2E, 3 and 4. In variations, there can be more than one connective element 515 per interposer 510.

The metal leadframe 500 can either be pre-plated with wire bondable finish (e.g. Silver (Ag), Nickel/Palladium/Gold (Ni/Pd/Au), etc.) or post-plated after plastic cavity molding (discussed below with reference to 640).

Figure 5B:
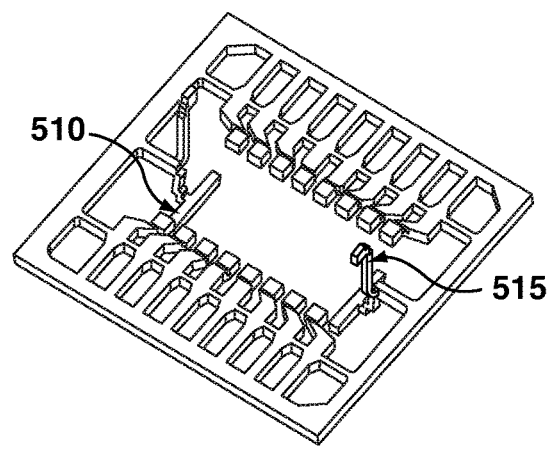

At 610, the interposer 510 is positioned downwardly and at 620 the connective element 515 is positioned upwardly (FIG. 5B).

Figure 5C:
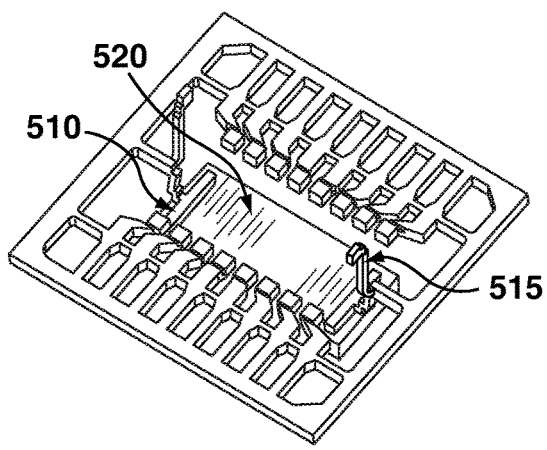

At 630 an appropriately dimensioned substrate 520 is positioned within the leadframe 500 and metallic feature(s) thereof are attached to the interposer 510, for example using epoxy, soldering, welding, etc. (FIG. 5C).

The substrate is made of material (e.g. $Al_2O_3$, AlN, Ceramic, Si, GaAs, etc) for the purpose of matching the coefficient of thermal expansion with the semiconductor device (die) to be affixed to the top of the substrate, in order to mitigate any temperature-induced stress from the affixed semiconductor device. The substrate 520 also provides a heat spreading surface to dissipate the heat generated from the semiconductor device once it has been affixed and is operational.

The substrate 520 may be fabricated with metal feature(s) on the top surface for connection with the interposer 510 and for wire bonding to the die. The metal features would allow the formation of either a ground plane, when connected to the appropriate leads on the inner leadframe, for example, or a power plane, when connected to appropriate leads on the inner leadframe, or both. Metal features may also, optionally, be fabricated on the bottom surface for soldering to the PCB mother board (not shown).

The interposer 510 therefore provides a bonding surface and coupling interface with the substrate 520.

At 640, the substrate-attached leadframe is molded to form a pre-molded cavity leadframe 530 featuring the top side of the inner leadframe leads 535 and top side of the interposer 510 exposed for wire bonding, the top side of the substrate 520 exposed for die attach and wire bonding, and the bottom side of the substrate 520 (not shown) exposed for bonding to the PCB motherboard.

Figure 5D:
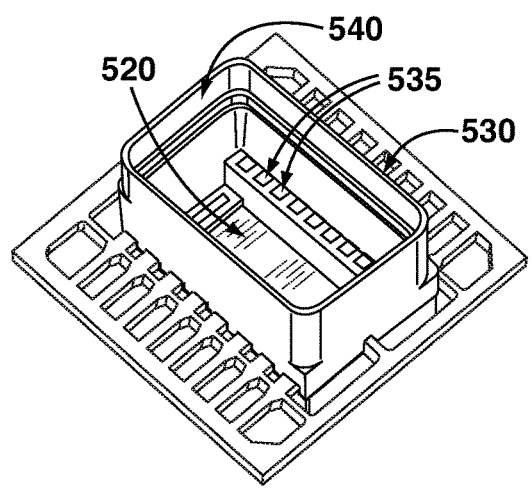
Figure 6:
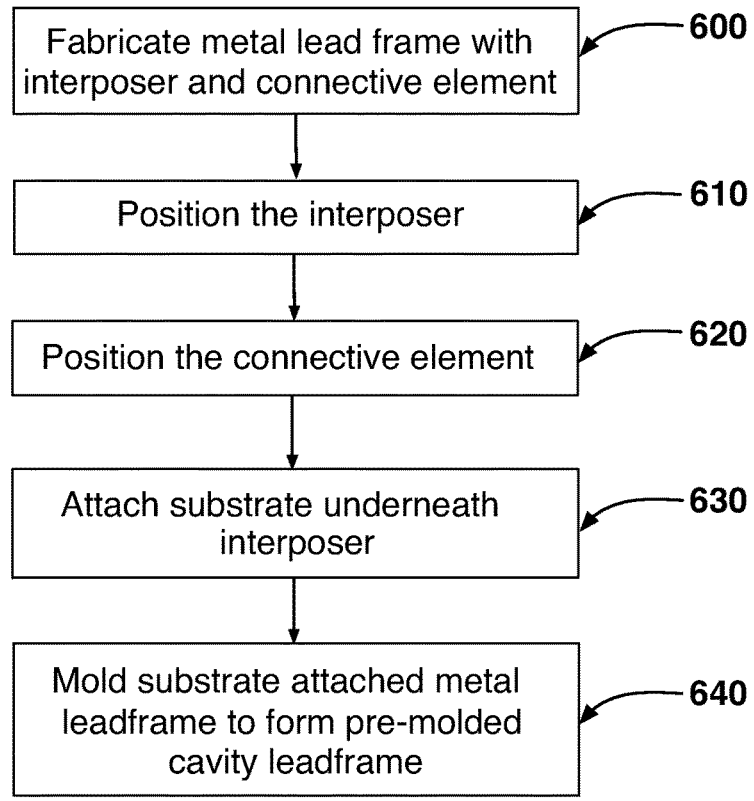
FIG. 6 is a flowchart showing steps in a process for constructing the cavity package of FIGS. 5A-5D.
Figure 7:
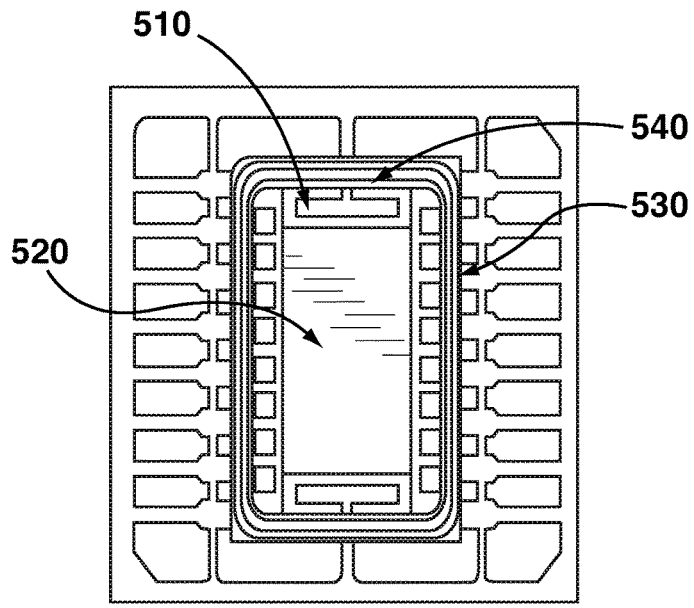
FIG. 7 is a plan view of the cavity package constructed according to FIGS. 5A-5D and 6.

The connective element 515 extends through leadframe 530 and, as shown in FIGS. 5D and 7, is exposed at 540 to provide an electrical path for connecting the interposer 510 to a metal lid to (not shown) for closing and encapsulating the substrate cavity. The electrical path could be used for grounding.

FIG. 7 is a plan view of the cavity-molded leadframe 530 with pre-attached substrate, according to the embodiment of FIGS. 5A-5D and 6.

Figure 8A:
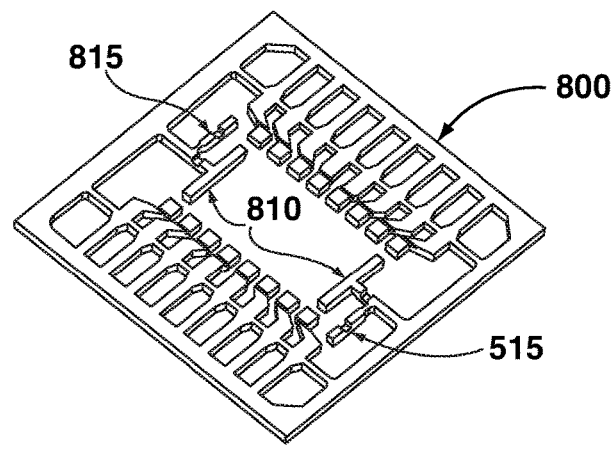
FIGS. 8A-8D are schematic illustrations showing construction of a cavity package according to an additional embodiment of the present invention.

Turning to FIGS. 8A-8D and 9, construction of a cavity package is set forth according to an additional embodiment of the present invention. At 900, a metal (e.g. Cu) leadframe 800 is fabricated with at least one interposer 810 and connective element 815, as shown in FIG. 8A. In the illustrated embodiment, connective element 815 functions in the same manner as 515 in the embodiment set forth in FIGS. 5A-5D and 6. In variations, there can be more than one connective element 815 per interposer 810.

The metal leadframe 800 can either be pre-plated with wire bondable finish (e.g. Ag, Ni/Pd/Au, etc) or post-plated after plastic cavity molding (discussed below with reference to 930).

Figure 8B:
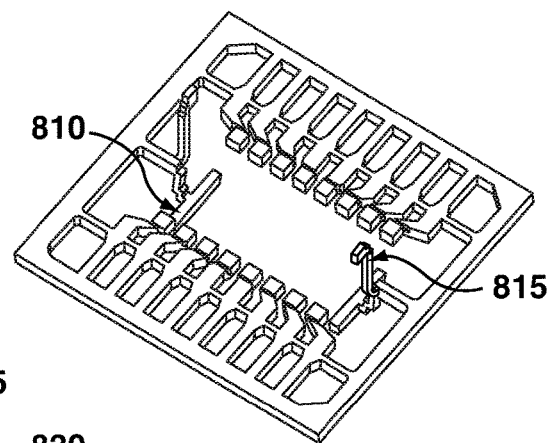
Figure 8C:
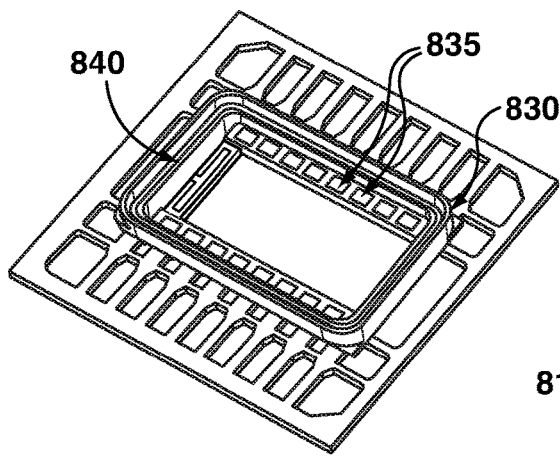

At 910, the interposer 810 is positioned downwardly and at 920 the connective element 815 is positioned upwardly (FIG. 8B).

At 930, the leadframe 800 is molded to form a pre-molded cavity leadframe 830 featuring the top side of the inner leadframe leads 835 and top side of the interposer 810 exposed for wire bonding.

Figure 8D:
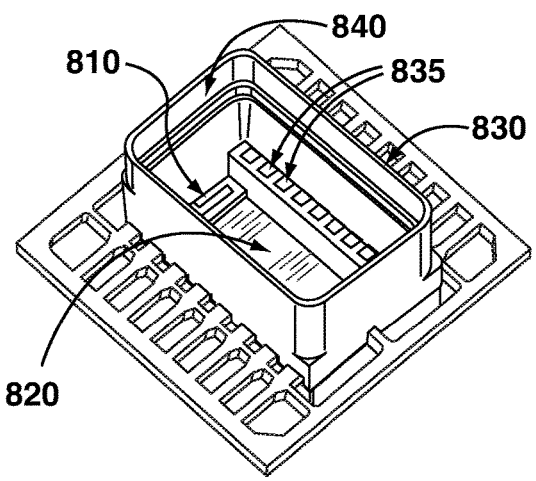
Figure 9:
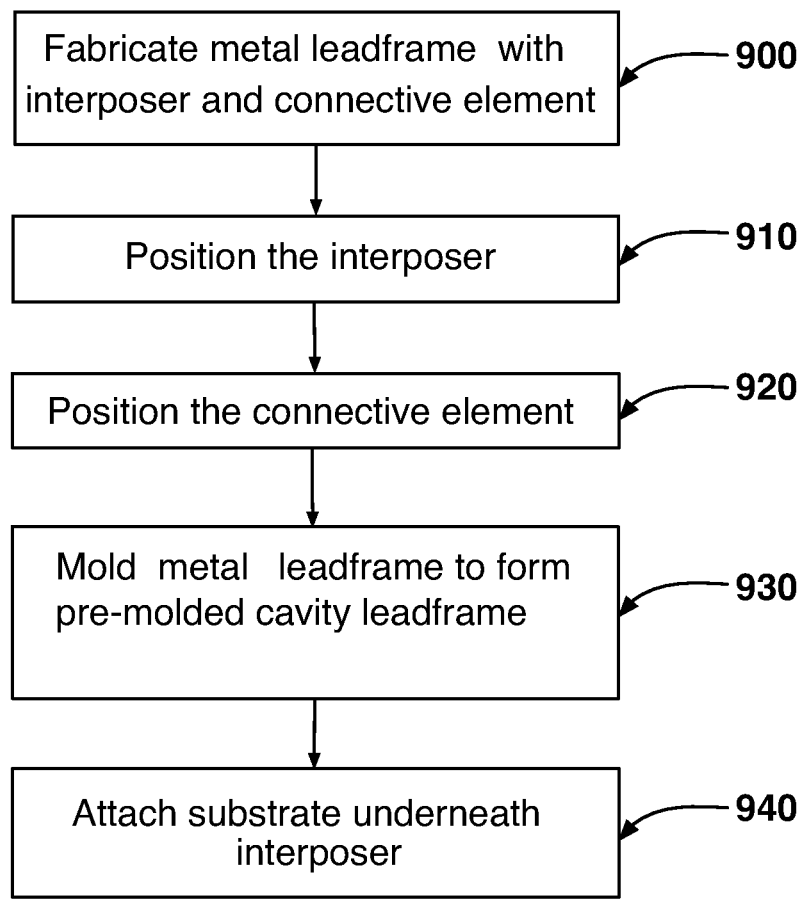
FIG. 9 is a flowchart showing steps in a process for constructing the cavity package of FIGS. 8A-8D.

The connective element 815 extends through leadframe 830 and, as shown in FIG. 8D, is exposed at 840 to provide an electrical path for connecting the interposer 810 to a metal lid to (not shown). The electrical path could be used for grounding. In variations, there can be more than one connective element 815 per interposer 810.

At 940 an appropriately dimensioned substrate 820 is positioned within the leadframe 830 and metallic feature(s) thereof are attached to the interposer 810, for example using epoxy, soldering, welding, etc. (FIG. 8D).

The substrate is made of material (e.g. $Al_2O_3$, AlN, Ceramic, Si, GaAs, etc) for the purpose of matching the coefficient of thermal expansion with the semiconductor device (die) to be affixed to the top of the substrate, in order to mitigate any temperature-induced stress from the affixed semiconductor device. The substrate 820 also provides a heat spreading surface to dissipate the heat generated from the semiconductor device once it has been affixed and is operational.

The substrate 820 may be fabricated with metal feature(s) on the top surface for connection with the interposer 810 and for wire bonding to the die. The metal features would allow the formation of either a ground plane, when connected to the appropriate leads on the inner leadframe, for example, or a power plane, when connected to appropriate leads on the inner leadframe, or both. Metal features may also, optionally, be fabricated on the bottom surface for soldering to the PCB mother board (not shown).

The interposer 810 therefore provides a bonding surface and coupling interface with the substrate 820.

Figure 10:
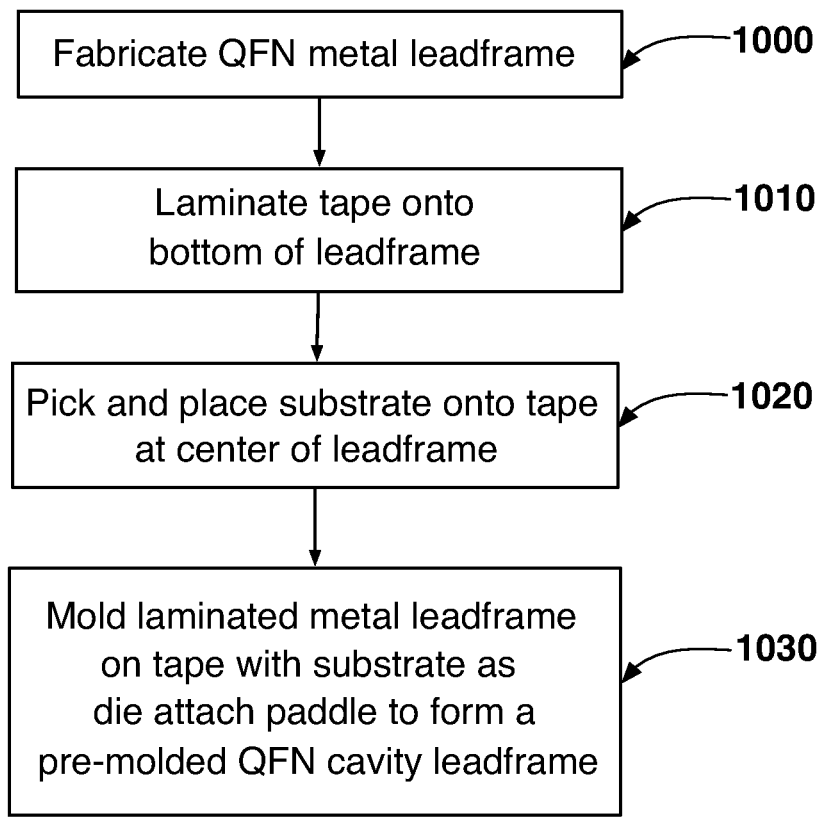
FIG. 10 is a flowchart showing steps in a process for constructing a cavity package according to a further QFN (quad-flat no-leads) embodiment of the present invention.
Figure 11A:
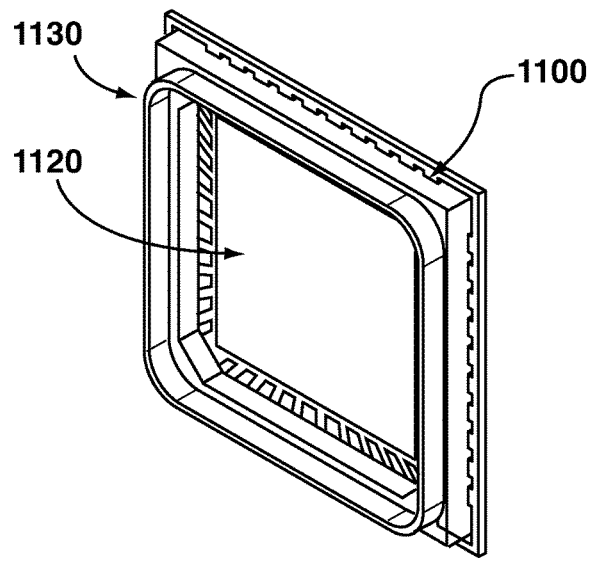
FIGS. 11A-11C are perspective, bottom and plan views, respectively, of the cavity package constructed according to the process of FIG. 10.
Figure 11B:
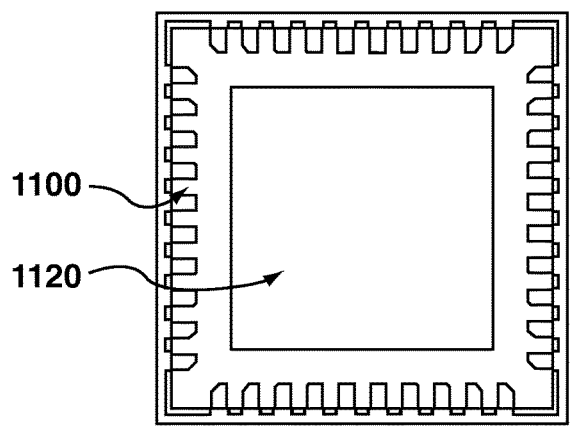
Figure 11C:
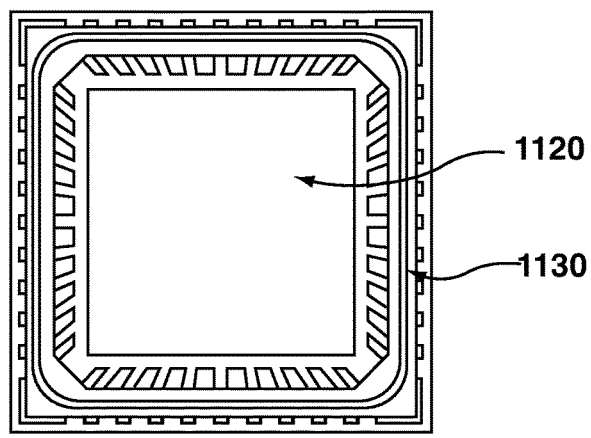

FIG. 10 is a flowchart showing steps in a process for constructing a cavity package according to a further QFN (quad-flat no-leads) embodiment of the present invention, and FIGS. 11A-11C are perspective, bottom and plan views, respectively, of the cavity package constructed according to the process of FIG. 10.

At 1000, a QFN metal (e.g. Cu) leadframe 1100 is fabricated (without die attach pad). At 1010, tape is laminated to the bottom surface of the leadframe 1100, and at 1020 substrate 1120 is placed onto the tape at the center of the leadframe unit (e.g. using pick-and-place equipment to form a die attach paddle.

The adhesive of the tape is exposed on the tope side (leadframe with a hollow center. We attach a substrate. Mold, the laminated leadframe which attached the ceramic substrate and the leadframe. Remove the tape. Ceramic is held up by the mold compound.

The substrate is made of material (e.g. $Al_2O_3$, AlN, Ceramic, Si, GaAs, etc) for the purpose of matching the coefficient of thermal expansion with the semiconductor device (die) to be affixed to the top of the substrate, in order to mitigate any temperature-induced stress from the affixed semiconductor device. The substrate 1120 also provides a heat spreading surface to dissipate the heat generated from the semiconductor device once it has been affixed and is operational.

The substrate 1120 may be fabricated with metal feature(s) on the top surface for wire bonding to the die. The metal features would allow the formation of either a ground plane, or a power plane or both. Metal features may also, optionally, be fabricated on the bottom surface for soldering to the PCB mother board (not shown).

Then, at 1030, the taped metal leadframe 1100 and taped substrate 1120 are molded to form a pre-mold QFN cavity package 1130 with substrate 1120 functioning as a die attach paddle. The plastic portion is molded to the leadframe forming a substrate cavity. The tape can be subsequently removed as the cavity package 1130 now holds together leadframe 1100 and substrate 1120.

In variations, one or more connective elements for connecting the metal features of substrate 1120 with a metal lid can be included for grounding the lid. The connective elements can be formed with the leadframe 1100, or into the cavity package 1130 as separate elements.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A cavity package receiving a semiconductor device therein, comprising:
   a metal leadframe;
   a substrate attached to the leadframe, the substrate having a coefficient of thermal expansion matched to a coefficient of thermal expansion of the semiconductor device to be affixed to the substrate; and
   a plastic portion molded to the leadframe defining a substrate cavity including an exposed top surface of the substrate to affix the semiconductor device; wherein
   the leadframe includes an interposer and the substrate is attached to the interposer;
   the substrate includes electrically isolated metallic features on the top surface to wire bond with the semiconductor device;
   the metallic features are capable of defining a ground plane and being connected with the interposer;
   the cavity package further includes:
      a metal lid attached to the plastic portion to close and encapsulate the substrate cavity; and
      a connective element to ground the lid by an electrical path from the lid to the interposer.

2. The cavity package of claim 1, wherein the plastic portion includes a slot and the connective element is inserted into the slot.

3. The cavity package of claim 1, wherein the connective element is fabricated with the leadframe.

4. The cavity package of claim 1 wherein metal features are fabricated on an exposed bottom surface of the substrate for soldering to a PCB board for facilitating heat dissipation.

5. The cavity package of claim 1 wherein the substrate made from one of: Aluminum Oxide (Al2O3), Aluminum Nitride (AlN), Ceramic, Silicone (Si), Gallium Arsenide (GaAs).

* * * * *